(12) United States Patent
Xie et al.

(10) Patent No.: US 10,636,857 B2
(45) Date of Patent: Apr. 28, 2020

(54) ARRAY SUBSTRATE, METHOD FOR FABRICATING THE SAME AND DISPLAY DEVICE

(71) Applicant: BOE Technology Group Co., Ltd., Beijing (CN)

(72) Inventors: Dini Xie, Beijing (CN); Xiaojin Zhang, Beijing (CN); Wei Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/083,057

(22) PCT Filed: Dec. 14, 2017

(86) PCT No.: PCT/CN2017/116148
§ 371 (c)(1),
(2) Date: Sep. 7, 2018

(87) PCT Pub. No.: WO2018/153146
PCT Pub. Date: Aug. 30, 2018

(65) Prior Publication Data
US 2019/0081080 A1    Mar. 14, 2019

(30) Foreign Application Priority Data
Feb. 24, 2017  (CN) .......................... 2017 1 0103356

(51) Int. Cl.
*H01L 27/32* (2006.01)
*H01L 27/12* (2006.01)
(Continued)

(52) U.S. Cl.
CPC ...... *H01L 27/3272* (2013.01); *H01L 27/1218* (2013.01); *H01L 27/1225* (2013.01);
(Continued)

(58) Field of Classification Search
CPC ............. H01L 27/1262; H01L 27/3244; H01L 27/3272; H01L 29/78633; H01L 29/7869;
(Continued)

(56) References Cited

U.S. PATENT DOCUMENTS 5,686,980 A  *  11/1997  Hirayama .........  H01L 31/02164
349/110
6,844,674 B2     1/2005  Chang et al.
(Continued)

FOREIGN PATENT DOCUMENTS

| CN | 1866573   | 11/2006 |
|----|-----------|---------|
| CN | 102956824 | 3/2013  |

(Continued)

OTHER PUBLICATIONS

Chinese Office Action corresponding to Chinese Patent Application No. 201710103356.1, dated Mar. 5, 2019 (14 pages with English translation).

(Continued)

*Primary Examiner* — Feifei Yeung Lopez
(74) *Attorney, Agent, or Firm* — Myers Bigel, P.A.

(57) ABSTRACT

An array substrate, a method for fabricating the same and a display device are disclosed. The array substrate includes a substrate, and a first insulating layer and a thin film transistor which are arranged on the substrate in this order. The first insulating layer includes a colored region which is configured to absorb light. An orthographic projection of the colored region on the substrate at least covers an orthographic projection of the active layer of the thin film transistor on the substrate. By arranging the colored region of the first insulating layer, the light with a short wavelength from an external light source is absorbed. Thus, a channel of the active layer is protected, stable performance of a device is realized, and a service life of the device is prolonged.

13 Claims, 1 Drawing Sheet

(51) Int. Cl.
| | |
|---|---|
| *H01L 29/786* | (2006.01) |
| *H01L 51/52* | (2006.01) |
| *H01L 29/66* | (2006.01) |
| *H01L 31/0216* | (2014.01) |
| *H01L 27/148* | (2006.01) |
| *H01L 27/146* | (2006.01) |

(52) U.S. Cl.
CPC .... *H01L 27/1262* (2013.01); *H01L 27/14623* (2013.01); *H01L 27/14818* (2013.01); *H01L 27/3244* (2013.01); *H01L 29/66969* (2013.01); *H01L 29/7869* (2013.01); *H01L 29/78633* (2013.01); *H01L 31/02164* (2013.01); *H01L 51/5284* (2013.01)

(58) Field of Classification Search
CPC .......... H01L 51/5284; H01L 27/14818; H01L 27/14623; H01L 31/02164
See application file for complete search history.

(56) References Cited

U.S. PATENT DOCUMENTS

2005/0008052 A1* 1/2005 Nomura ................ H01L 27/322
372/39
2006/0263593 A1 11/2006 Aziz et al.
2013/0048993 A1 2/2013 Katsuhara et al.
2013/0207087 A1* 8/2013 Kim .................... H01L 27/3225
257/40
2015/0162420 A1* 6/2015 Park .................. H01L 29/66742
438/151
2017/0221935 A1* 8/2017 Liu ....................... H01L 21/425

FOREIGN PATENT DOCUMENTS

| CN | 103247659 | 8/2013 |
|---|---|---|
| CN | 104979203 | 10/2015 |
| CN | 105070729 | 11/2015 |
| CN | 105810718 | 7/2016 |
| CN | 106887438 | 6/2017 |
| WO | PCT/CN2016/071734 | * 3/2017 |

OTHER PUBLICATIONS

International Search Report and Written Opinion of the International Searching Authority for corresponding PCT Application No. PCT/CN2017/116148 (Foreign Text, 11 pages; English Translation, 4 pages) (dated Mar. 14, 2018).

* cited by examiner

US 10,636,857 B2

ARRAY SUBSTRATE, METHOD FOR FABRICATING THE SAME AND DISPLAY DEVICE

CROSS-REFERENCE TO RELATED APPLICATIONS

The present application is a 35 U.S.C. 371 national stage application of PCT International Application No. PCT/CN2017/116148, filed on Dec. 14, 2017, which claims the benefit of Chinese patent application No. 201710103356.1, filed on Feb. 24, 2017, the contents of which are incorporated herein by reference in their entireties. The above-referenced PCT International Application was published in the Chinese language as International Publication No. WO 2018/153146 A1 on Aug. 30, 2018.

TECHNICAL FIELD

The present disclosure relates to the field of display technologies, and particularly to an array substrate, a method for fabricating the same and a display device.

BACKGROUND

An oxide semiconductor material, due to its advantages of high carrier mobility, low preparation temperature, good electrical uniformity, being transparent to visible light, low cost and the like, is considered among the most suitable semiconductor active materials of a thin film transistor (TFT) for driving an organic light emitting diode (OLED). Currently, an oxide TFT has been widely applied to an array substrate of a flat panel display. The oxide semiconductor is so sensitive to light that it should be shield to prevent ambient light from affecting performance of TFT. Especially for a TFT of a top gate structure, an active layer is located relatively close to a substrate, so that it is prone to irradiation by an external light source below the panel, which results in degradation of the device performance.

SUMMARY

Embodiments of the present disclosure provide an array substrate, a method for fabricating the same and a display device, which intend to alleviate or solve one or more of the problems as mentioned above.

In a first aspect, the present disclosure provides an array substrate, comprising a substrate, and a first insulating layer and a thin film transistor which are arranged on the substrate in this order, and the first insulating layer comprises a colored region which is configured to absorb light, and an orthographic projection of the colored region on the substrate at least covers an orthographic projection of the active layer of the thin film transistor on the substrate.

In an embodiment, the colored region of the first insulating layer is capable of absorbing light in a wavelength range of 200-500 nm.

In an embodiment, a material of the colored region of the first insulating layer comprises oxide, nitride, oxynitride, or a mixture of at least two of oxide, nitride, oxynitride, and is doped with metal ions.

In an embodiment, the oxide, nitride or oxynitride comprises $SiO_x$, $SiO_xN_y$, $SiN_x$, $Al_2O_3$, $AlO_xN_y$, $AlN_x$.

In an embodiment, the doped metal ions comprise $Cu^+$, $Au^{2+}$, $Mn^{2+}$, $Cd^{2+}$, $Fe^{2+}$, $Co^{3+}$, $Cr^{3+}$, $Fe^{3+}$, or a mixture of at least two of $Cu^+$, $Au^{2+}$, $Mn^{2+}$, $Cd^{2+}$, $Fe^{2+}$, $Co^{3+}$, $Cr^{3+}$, $Fe^{3+}$.

In an embodiment, the metal ions are doped by a ratio of 1-100%, for example, 20-60%.

In an embodiment, the thin film transistor is a top gate type thin film transistor, comprising an active layer, a gate insulating layer, a gate, a second insulating layer and a source and drain electrode layer which are arranged in this order. The source and drain electrode is electrically connected with the active layer through a via hole penetrating the interlayer insulating layer.

In a second aspect, embodiments of the present disclosure provide a display device, comprising the array substrate as mentioned above.

In a third aspect, embodiments of the present disclosure provide a method fabricating the same an array substrate, comprising forming a first insulating layer and a thin film transistor on a substrate in this order. The method further comprises: after the first insulating layer is formed, forming a colored region which is configured to absorb light in the first insulating layer, wherein an orthographic projection of the colored region on the substrate at least covers an orthographic projection of the active layer of the thin film transistor on the substrate.

In an embodiment, the colored region is formed by performing ion implantation in a selected region of the first insulating layer.

In an embodiment, the first insulating layer comprises oxide, nitride, oxynitride, or a mixture of at least two of oxide, nitride, oxynitride, and wherein the colored region is formed by doping metal ions into the selected region.

DETAILED DESCRIPTION

Figure 1:
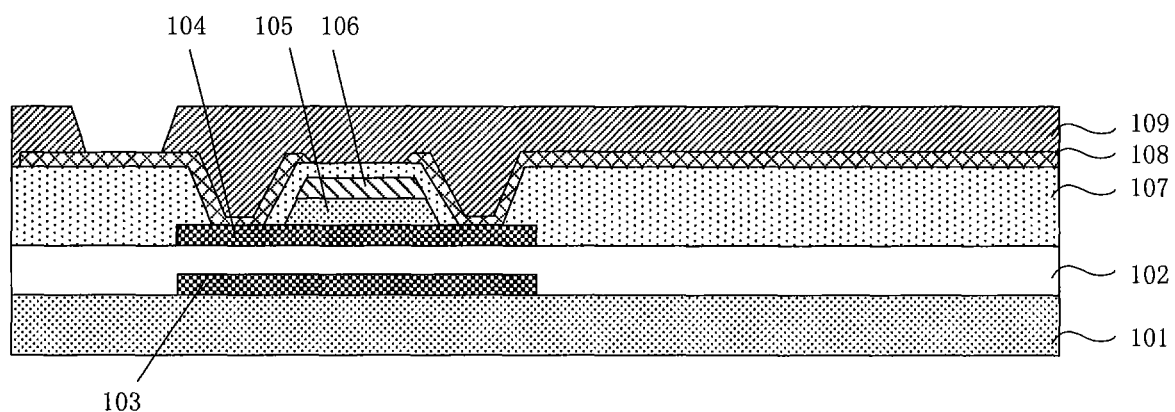
FIG. 1 is a schematic structural diagram of an oxide semiconductor TFT array substrate.

In order to make the objects, technical solutions and advantages of the present disclosure more apparent, the present disclosure will be clearly and completely described hereinafter in a detailed manner with reference to the accompanying drawings. Apparently, the described embodiments are part of the embodiments of the present disclosure, rather than all embodiments. Based on the embodiments of in the present disclosure, all other embodiments obtained by those skilled in the art without creative efforts are all within the protection scope of the present disclosure.

The size and shape of each component in the drawings do not reflect the true scale of the array substrate, which are merely intended to illustrate the present disclosure.

Reference numbers: 101—substrate, 102—first insulating layer, 103—metal shielding layer, 104—active layer, 105—gate insulating layer, 106—gate layer, 107—second insulating layer, 108—source and drain electrode layer, 109—passivation layer, 110—colored region.

As shown in FIG. 1, a metal shielding layer 103 is arranged under an active layer 104 of the TFT of a top gate structure to shield the active layer, so that the irradiation of an external light source is avoided, and the performance of the device is kept stable. However, this method has certain limitations. The metal shielding layer is not directly adjacent with the active layer, and an insulating layer of a certain thickness is present there-between, so that an external light source may enter the insulating layer from the side to irradiate the active layer. Meanwhile, an excessively large metal shielding layer may affect the performance of TFT, and for example may result in drifting of an initial threshold value, declining of uniformity, and so on. Therefore, the area of the metal shielding layer shall not be too large, and may only be slightly larger than the size of the active layer. Meanwhile, despite the metal shielding layer may be utilized in the oxide semiconductor thin film transistor array substrate having the above structure, it brings about problems during the preparation of the low-temperature polycrystalline silicon thin film transistor array substrate, such as a relatively complicated fabricating process, a relatively high cost, a relatively long time and so on.

Figure 2:
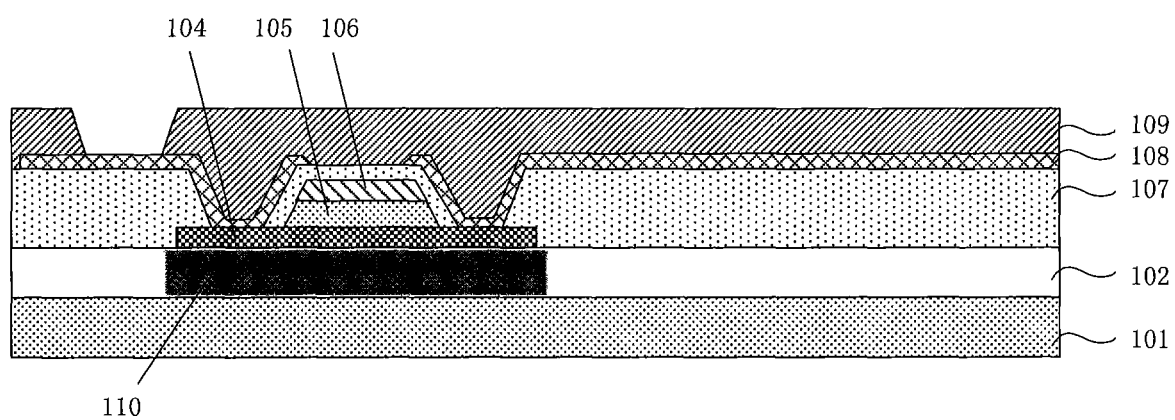
FIG. 2 is a schematic structural diagram of an oxide semiconductor TFT array substrate according to embodiments of the present disclosure.

In an embodiment of the present disclosure, as shown in FIG. 2, an array substrate comprises a substrate 101, and a first insulating layer 102 and a thin film transistor which are arranged on the substrate in this order. The thin film transistor is a top gate type thin film transistor, and comprises an active layer 104, a gate insulating layer 105, a gate 106, a second insulating layer 107, and a source and drain electrode layer 108 which are arranged in this order. The source and drain electrode layer 108 is electrically connected with the active layer 104 through a via hole penetrating the second insulating layer 107. The first insulation layer 102 comprises a colored region 110 which is configured to absorb light. In order to effectively shield the active layer 104 from being irradiated by external ambient light, an orthographic projection of the colored region 110 on the substrate 101 at least covers an orthographic projection of the active layer 104 of the thin film transistor on the substrate 101. The colored region 110 is arranged, for example, at a position close to the active layer 104. However, the coverage range of the colored region 110 on the plane where the first insulating layer 102 is located should not be too large. Otherwise, the effective display light-emitting region would be shield, and the aperture ratio would reduce. For example, if the structure is applied to a top-emitting organic electroluminescent display device structure, the entire first insulating layer 102 may be colored. If the structure is applied to a bottom-emitting organic electroluminescent display device structure, all regions except the display light-emitting region should be shielded.

Since the electrical properties of the oxide semiconductor TFT are mainly affected by light in the short wavelength band, the colored region, for example, absorbs the light of the wavelength range in the 200-500 nm. Namely, a colored region of an insulating layer exhibiting red or yellow color is used to absorb light in the short wavelength band from the incident light, and the remaining light with a long wavelength may not affect the performance of the active layer due to its low energy. In addition, considering that the colored region of the insulating layer with a too low light transmittance would affect observation of the process condition in the fabricating process of the array substrate, it is optimal that the colored region is translucent. The colored region of the insulating layer is made of oxide, nitride, oxynitride, or a mixture of at least two of oxide, nitride, oxynitride, and is doped with metal ions.

The oxide, nitride or oxynitride comprises $SiO_x$, $SiO_xN_y$, $SiN_x$, $Al_2O_3$, $AlO_xN_y$, $AlN_x$. The doped metal ions comprise $Cu^+$, $Au^{2+}$, $Mn^{2+}$, $Cd^{2+}$, $Fe^{2+}$, $Co^{3+}$, $Cr^{3+}$, $Fe^{3+}$, or a, mixture of at least two of $Cu^+$, $Au^{2+}$, $Mn^{2+}$, $Cd^{2+}$, $Fe^{2+}$, $Co^{3+}$, $Cr^{3+}$, $Fe^{3+}$. A doping ratio of the metal ions is 1-100%, for example, 20-60%. The higher the doping concentration of the metal ions is, the lower the transparency of the colored region is.

Optionally, a metal shielding layer 103 may still be arranged between the substrate and the active layer of the thin film transistor, and both the metal shielding layer and the colored oxide insulating layer are applied simultaneously to enhance the shading effect.

In another embodiment of the present disclosure, a display device is provided, which comprises the array substrate as mentioned above. As well known to those skilled in the art, the above array substrate may be used for OLED display, so that it may be combined with different devices to form an OLED display device. In order to achieve the function, the array substrate may further comprise other structures not mentioned in the present disclosure.

The above display device may be any product or component with a display function such as an electronic paper, a mobile phone, a tablet computer, a television, a notebook computer, a digital photo frame, a navigator etc. The display device according to embodiments of the present disclosure has the same technical features as any of the above array substrates, and thus may solve the same technical problems and achieve the same technical effect.

In yet another embodiment of the present disclosure, a method for fabricating an array substrate is provided, which comprises the following steps.

(1) providing a substrate 101, depositing a first insulating layer 102 on the substrate, and forming a colored region 110 which is configured to absorb light in the first insulating layer 102. The colored region is formed by oxide, nitride, oxynitride, or a mixture of at least two of oxide, nitride, oxynitride, and is doped with metal ions.

In a specific implementation, the first insulating layer 102 may be deposited by a plasma enhanced chemical vapor deposition, and specifically materials such as silicon dioxide, silicon nitride may be used. Then a target region of the first insulating layer 102 is doped by ion implantation to form a colored region 110. During ion implantation, a mask plate may be arranged in an appointed region to carry out ion implantation, and photoresist used in a patterning process may also be used for shielding during ion implantation, so that the orthographic projection of the colored region 110 on the substrate at least covers the orthographic projection of the active layer of the thin film transistor on the substrate.

In addition, a doped target material may be directly sputtered to form the colored region of the insulating layer, which is known to those skilled in the art and not described herein for simplicity.

The oxide, nitride or oxynitride comprises $SiO_x$, $SiO_xN_y$, $SiN_x$, $AlO_3$, $AlO_xN_y$, $AlN_x$. The doped metal ions comprise $Cu^+$, $Au^{2+}$, $Mn^{2+}$, $Cd^{2+}$, $Fe^{2+}$, $Co^{3+}$, $Cr^{3+}$, $Fe^{3+}$, or a mixture of at least two of $Cu^+$, $Au^{2+}$, $Mn^{2+}$, $Cd^{2+}$, $Fe^{2+}$, $Co^{3+}$, $Cr^{3+}$, $Fe^{3+}$. The doping ratio of the metal ions is 1-100%, for example, 20-60%.

(2) forming a top gate type thin film transistor on the first insulating layer 102, which comprises an active layer 104, a gate insulating layer 105, a gate 106, a second insulating layer 107 and a source and drain electrode layer 108 which are formed in this order through patterning processes, wherein the source drain electrode layer 108 is electrically connected with the active layer 104 through a via hole penetrating the second insulating layer 107.

(3) depositing a passivation layer 109, forming a via hole penetrating the second insulating layer 107 by a patterning process, and forming a pixel electrode (not shown) on the passivation layer 109. The pixel electrode is electrically connected with the source electrode or the drain electrode of the thin film transistor through the via hole. The fabrication of subsequent layers of the array substrate is performed, which is known to those skilled in the art and is not described herein for simplicity.

It should be noted that in the above method for fabricating an array substrate according to embodiments of the present disclosure, the patterning process may comprise only a photolithography process, or, may comprise the photolithography process and etching steps. Meanwhile, the patterning process may further comprise other processes for forming predetermined patterns, such as printing, injetting. The photolithography process refers to a process which forms patterns by using a photoresist, a mask plate, an exposure machine and the like and comprises processes such as film forming, exposing, developing and the like. In a specific implementation, a corresponding patterning process may be selected according to the structure formed in the present disclosure.

Embodiments of the present disclosure provide an array substrate, a method for fabricating the same and a display device. By arranging a colored insulating layer between the active layer and the substrate of the oxide semiconductor thin film transistor, the light with a short wavelength from an external light source is absorbed, so that a channel of an oxide semiconductor active layer is protected more effectively and comprehensively. The stable performance of the display device is maintained, the service life is prolonged, and the fabricating process is simple and easy to realize.

Apparently, the those skilled in the art may make various modifications and variations to the present disclosure without departing from the spirit and the scope of the present disclosure. In this way, provided that these modifications and variations of the present disclosure within the scopes of the claims of the present disclosure and the equivalent technologies thereof, the present disclosure also intends to encompass these modifications and variations.

What is claimed is:

1. An array substrate, comprising:
a substrate;
a first insulating layer; and
a thin film transistor,
wherein the first insulating layer is on the substrate and the thin film transistor is on the first insulating layer,
wherein the first insulating layer comprises a colored region which is configured to absorb light, and
wherein an orthographic projection of the colored region on the substrate at least overlaps an orthographic projection of an active layer of the thin film transistor on the substrate,
wherein a material of the colored region of the first insulating layer comprises oxide, nitride, oxynitride, or a mixture thereof, and the first insulating layer is doped with metal ions,
wherein the oxide, nitride or oxynitride comprises $SiO_x$, $SiO_xN_y$, $SiN_x$, $Al_2O_3$, $AlO_xN_y$, and/or $AlN_x$, and
wherein the metal ions comprise $Cu^+$, $Au^{2+}$, $Mn^{2+}$, $Cd^{2+}$, $Fe^{2+}$, $Co^{3+}$, $Cr^{3+}$, $Fe^{3+}$, or a mixture thereof.

2. The array substrate of claim 1,
wherein the colored region of the first insulating layer is configured to absorb light in a wavelength range of 200 nanometers (nm) to 500 nm.

3. The array substrate of claim 1, wherein the metal ions are doped by a ratio of 1-100%.

4. The array substrate of claim 3, wherein the metal ions are doped by a ratio of 20-60%.

5. The array substrate of claim 1,
wherein the thin film transistor comprises a top gate type thin film transistor,
wherein the thin film transistor comprises the active layer, a gate insulating layer, a gate, a second insulating layer and a source and drain electrode layer,
wherein the gate insulating layer is on the active layer,
wherein the source and drain electrode layer is on the second insulating layer, and
wherein the source and drain electrode layer is electrically connected with the active layer through a via hole penetrating the second insulating layer.

6. A display device, comprising:
an array substrate,
wherein the array substrate comprises a substrate, a first insulating layer and a thin film transistor,
wherein the first insulating layer is on the substrate and the thin film transistor is on the first insulating layer,
wherein the first insulating layer comprises a colored region which is configured to absorb light, and
wherein an orthographic projection of the colored region on the substrate at least overlaps an orthographic projection of an active layer of the thin film transistor on the substrate,
wherein a material of the colored region of the first insulating layer comprises oxide, nitride, oxynitride, or a mixture thereof, and the first insulating layer is doped with metal ions,
wherein the oxide, nitride or oxynitride comprises $SiO_x$, $SiO_xN_y$, $SiN_x$, $Al_2O_3$, $AlO_xN_y$, and/or $AlN_x$, and
wherein the metal ions comprise $Cu^+$, $Au^{2+}$, $Mn^{2+}$, $Cd^{2+}$, $Fe^{2+}$, $Co^{3+}$, $Cr^{3+}$, $Fe^{3+}$, or a mixture thereof.

7. A method for fabricating an array substrate, comprising:
forming a first insulating layer and a thin film transistor on a substrate, and
after forming the first insulation layer, forming a colored region which is configured to absorb light in the first insulation layer,
wherein an orthographic projection of the colored region on the substrate overlaps an orthographic projection of the active layer of the thin film transistor on the substrate,
wherein a material of the colored region of the first insulating layer comprises oxide, nitride, oxynitride, or a mixture thereof, and the first insulating layer is doped with metal ions,
wherein the oxide, nitride or oxynitride comprises $SiO_x$, $SiO_xN_y$, $SiN_x$, $Al_2O_3$, $AlO_xN_y$, and/or $AlN_x$, and
wherein the metal ions comprise $Cu^+$, $Au^{2+}$, $Mn^{2+}$, $Cd^{2+}$, $Fe^{2+}$, $Co^{3+}$, $Cr^{3+}$, $Fe^{3+}$, or a mixture thereof.

8. The method of claim 7, wherein the colored region is formed by performing ion implantation in a selected region of the first insulating layer.

9. The method of claim 8,
wherein the colored region is formed by doping the metal ions into the selected region of the first insulating layer.

10. The display device of claim 6, wherein the colored region of the first insulating layer is configured to absorb light in a wavelength range of 200 nanometers (nm) to 500 nm.

11. The display device of claim 6, wherein the metal ions are doped by a ratio of 1-100%.

12. The display device of claim 11, wherein the metal ions are doped by a ratio of 20-60%.

13. The display device of claim 6,
wherein the thin film transistor comprises a top gate type thin film transistor, wherein the thin film transistor comprises the active layer, a gate insulating layer, a gate, a second insulating layer and a source and drain electrode layer, wherein the gate insulating layer is on the active layer, wherein the source and drain electrode layer is on the second insulating layer, and wherein the source and drain electrode layer is electrically connected with the active layer through a via hole penetrating the second insulating layer.

* * * * *